(12) United States Patent
Hirohata

(10) Patent No.: US 6,904,583 B2
(45) Date of Patent: Jun. 7, 2005

(54) LAYOUT METHOD OF VOLTAGE DIVISION RESISTORS

(75) Inventor: Fukuichi Hirohata, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/252,675

(22) Filed: Sep. 24, 2002

(65) Prior Publication Data

US 2003/0192022 A1 Oct. 9, 2003

(30) Foreign Application Priority Data

Apr. 9, 2002 (JP) ........................................ 2002-106279

(51) Int. Cl.$^7$ ............................................. G06F 17/50
(52) U.S. Cl. ........................ 716/11; 716/13; 341/144; 341/150; 341/154; 341/161
(58) Field of Search ..................... 716/1, 4, 8, 10, 716/19; 702/61, 63; 368/157; 360/69; 355/71; 345/87, 98, 53, 101, 211; 341/154, 150, 144; 338/320, 307; 331/57, 143; 327/543; 324/158.1, 318; 257/467, 296; 323/318

(56) References Cited

U.S. PATENT DOCUMENTS

| | | | | |
|---|---|---|---|---|
| 5,521,576 A | * | 5/1996 | Collins | .................. 338/307 |
| 5,627,457 A | * | 5/1997 | Ishiyama et al. | ............ 323/318 |
| 5,929,746 A | * | 7/1999 | Edwards et al. | ............. 338/320 |
| 6,052,337 A | * | 4/2000 | Yuzuki et al. | ............... 368/157 |
| 6,462,625 B2 | * | 10/2002 | Kim | ............................ 331/57 |
| 6,505,329 B1 | * | 1/2003 | Matsuzawa | .................... 716/8 |
| 6,753,679 B1 | * | 6/2004 | Kwong et al. | ............ 324/158.1 |
| 2002/0158862 A1 | * | 10/2002 | Chen et al. | .................. 345/211 |
| 2003/0038332 A1 | * | 2/2003 | Kimura | ....................... 257/467 |
| 2003/0154456 A1 | * | 8/2003 | Koike et al. | .................... 716/8 |

FOREIGN PATENT DOCUMENTS

| | | | | | |
|---|---|---|---|---|---|
| JP | 05129519 A | * | 5/1993 | ........... | H01L/27/04 |
| JP | 09068695 A | * | 3/1997 | ........... | G02F/1/133 |

* cited by examiner

*Primary Examiner*—A. M. Thompson
*Assistant Examiner*—Helen Rossoshek
(74) *Attorney, Agent, or Firm*—Rabin & Berdo P.C.

(57) ABSTRACT

With a layout method for voltage division resistors, employing a photolithographic system, resistors which are required to have relative accuracy are disposed in the center of a layout area so as to be adjacent with each other, and another resistor is divided, so that divided portions thereof are disposed on the outer side of the resistors maintaining high accuracy, respectively, ends of the divided portions, positioned on the opposite sides of the voltage division resistors, respectively, being connected with each other.

14 Claims, 3 Drawing Sheets
LAYOUT METHOD OF VOLTAGE DIVISION RESISTORS

BACKGROUND OF THE INVENTION

1. Field of the Invention

The present invention relates to a layout method for voltage division resistors of a liquid crystal bias level generation circuit in a liquid crystal display (LCD) driver, and in particular, to a layout method for voltage division resistors in the case of employing a photolithographic system having manufacturing variations in the longitudinal direction of a layout area.

2. Description of the Related Art

In general, a conventional layout of voltage division resistors of a liquid crystal bias level generation circuit in a liquid crystal display (LCD) driver has been designed such that resistors R1, R2, R3, R4, and R5 are laid out in sequence from left to right as shown in FIG. 3 in the case where a resistance ratio of R1 to R5 is set at 1:1:(n−4):1:1(n represents the number of biases, assuming a value in the order of n=6~13) as shown in the figure. That is, according to a conventional designing technique, as for R1, R2 portions of the voltage division resistors, each having an identical resistance value, a portion extending to a length L (pattern width: W) from the extreme left is designated the resistor R1, and another portion extending to a length L from R1 is designated the resistor R2. As for the resistor R3, a portion extending to a length L (n−4) from the back-end of R2 is designated the resistor R3, and the resistors R4, R5, extending to a length L from the back-end of R3, and R4, respectively, are laid out.

With the conventional technique of designing voltage division resistors, however, there has arisen a problem that, in the case of laying out the voltage division resistors by use of a photolithographic system having manufacturing variations in the longitudinal direction of a layout area, there result variations in accuracy of resistance value of the respective voltage division resistors, that is, in relative accuracy of divided voltage levels.

More specifically, if reduction in power consumption is attempted by decreasing current flowing through voltage division resistors in the case of the voltage division resistors being manufactured of polysilicon material from the viewpoint of layout efficiency, there is the need for setting a resistance value of the respective voltage division resistors to a high value. In such a case, assuming that polysilicon resistors are designed to have the minimum widths that are manufacturing limits, resistance values of the voltage division resistors should be designed to have relative values expressed by a ratio of 1:1:(n−4):1:1 at 1/n bias, however, in the case of employing the photolithographic system having the characteristic described above, there has arisen a case where while resistance width W of the resistor R3 disposed in the vicinity of the center in FIG. 3 is 0.70 μm, resistance width W of the resistor R5 at the extreme right is 0.65 μm, and resistance width W of the resistor R1 at the extreme left is 0.75 μm. Accordingly, if voltage is divided with the use of such voltage division resistors, a divided voltage ratio will be 0.93:0.95:(n−4):1.05:1.07, thus resulting in variations of divided voltages, so that there has arisen a problem that a specification as required can not be met.

It is therefore an object of the invention to provide a layout method for voltage division resistors, enabling variations in divided voltages to be controlled within required accuracy.

SUMMARY OF THE INVENTION

In a first aspect of the invention, there is provided a layout method for voltage division resistors, employing a photolithographic system, wherein resistors required to have relative accuracy are disposed in the center of a layout area so as to be adjacent with each other, and another resistor is divided, so that divided portions thereof are disposed on the outer side of the resistors maintaining high accuracy, respectively, ends of the divided portions, positioned on the opposite sides of the voltage division resistors, respectively, being connected with each other. Accordingly, it becomes possible to manufacture highly accurate voltage division resistors having small variations in resistance values thereof even in the case of employing a photolithographic system having manufacturing variations in the longitudinal direction of the layout area.

Further, in a second aspect of the invention, there is provided a layout method for voltage division resistors, employing a photolithographic system, wherein a pattern of respective resistors of the voltage division resistors is oriented in the longitudinal direction of a layout area. Accordingly, it becomes possible to manufacture highly accurate voltage division resistors having small variations in resistance values thereof even in the case of employing a photolithographic system having manufacturing variations in the longitudinal direction of the layout area.

DETAILED DESCRIPTION OF THE PREFERRED EMBODIMENTS

Preferred embodiments of the invention are described in detail hereinafter with reference to the accompanying drawings. In the figures, the size, shape, and disposition relationship of respective constituent parts are broadly shown merely to such an extent that the invention can be better understood, and numerical conditions described hereinafter are given merely by way of example.

First Embodiment

Figure 1:
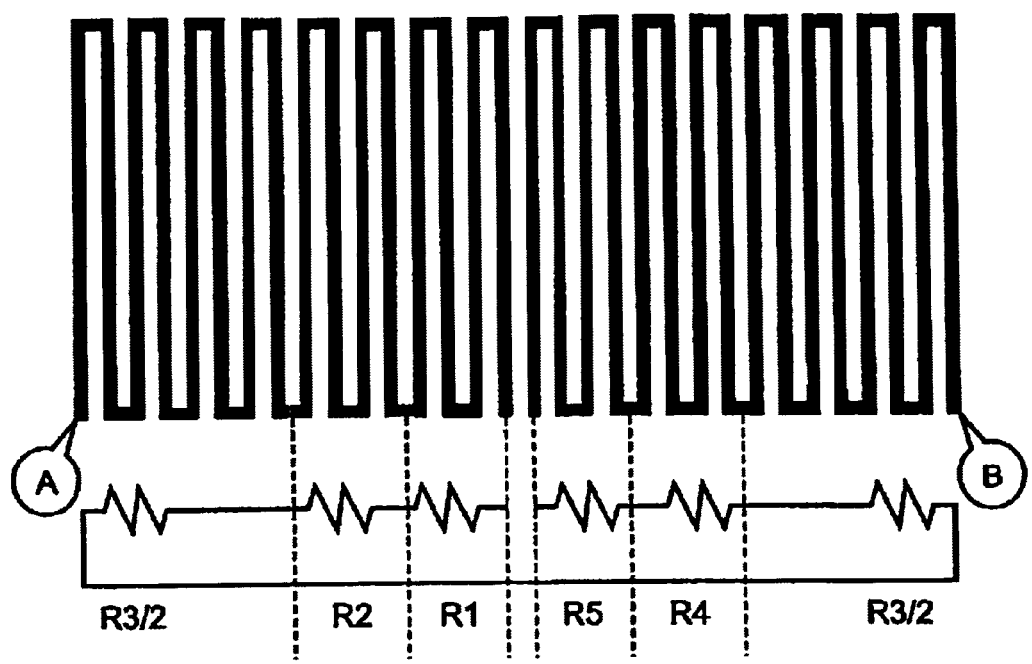
FIG. 1 is a view showing a first embodiment of a layout method for voltage division resistors according to the invention.

FIG. 1 is a view showing a first embodiment of a layout method for voltage division resistors according to the invention, and in the case of a ratio of resistance values of resistors R1, R2, R3, R4, and R5 being equivalent to the previously described ratio of 1:1:(n−4):1:1, the resistors R2, R1 as well as the resistors R5, R4, which are required to have high accuracy, are disposed in the center so as to be adjacent with each other. That is, as shown in the figure, the resistor R3 is divided into halves, and R3/2, R2, and R1 are disposed in sequence from left to right, and to the right side thereof, R5, R4, and R3/2 are disposed in sequence. However, there is adopted a configuration such that the right end of R1 is not connected with the left end of R5 while points A and B of R3/2 and R3/2, respectively, positioned at the opposite ends of the voltage division resistors, are connected with each other via a low resistance.

By designing a layout of the voltage division resistors as described above, the resistors R1, R2, and R4, R5, required to have high accuracy, are laid out so as to be adjacent with each other, and consequently, are rendered less prone to adverse effects of manufacturing variations of the photolithographic system. As for the resistor R3, halves thereof are disposed apart from each other, at right and left, and consequently, even if respective resistance values are subjected to the influence of the manufacturing variations of the photolithographic system, the influence will be reduced in terms of a total resistance value, so that voltage division resistors, highly accurate as a whole, can be expected. In the actual case of manufacturing voltage division resistors at the manufacturing limit of a photolithographic system having manufacturing variations in the longitudinal direction of a layout area, voltage division accuracy can be expressed by a ratio of 0.988:0.965:(n−4):1.035:1.012 on the basis of measured values to thereby attain voltage division accuracy satisfying a specification as required.

Second Embodiment

Figure 2:
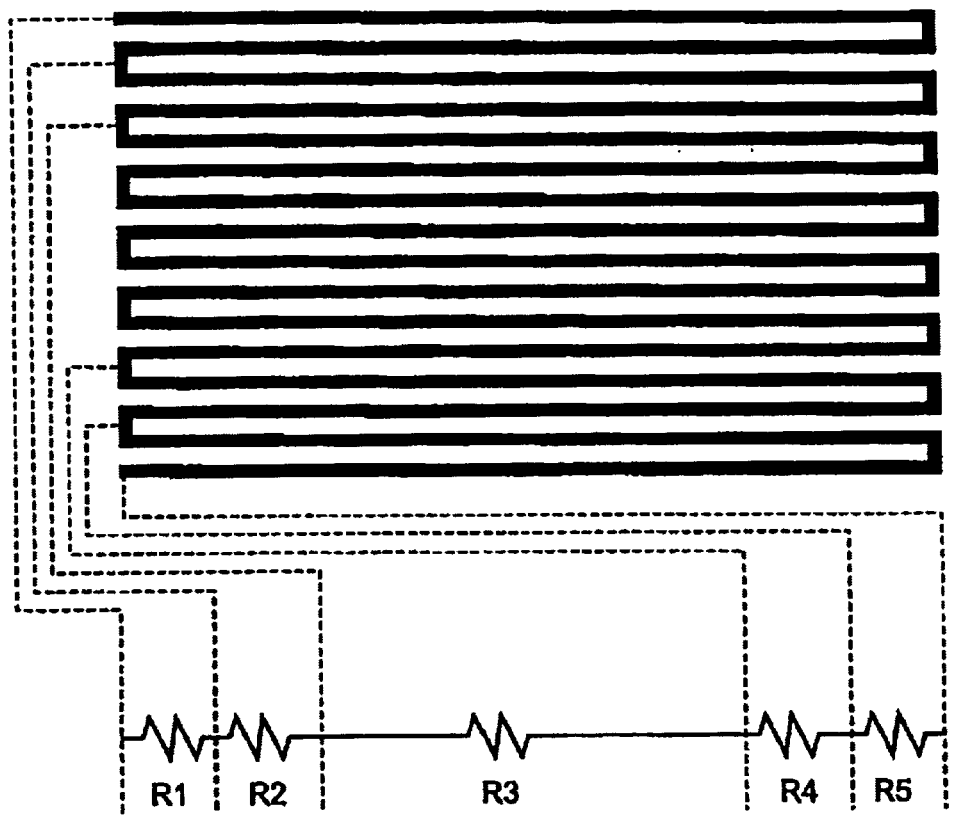
FIG. 2 is a view showing a second embodiment of a layout method for voltage division resistors according to the invention.
Figure 3:
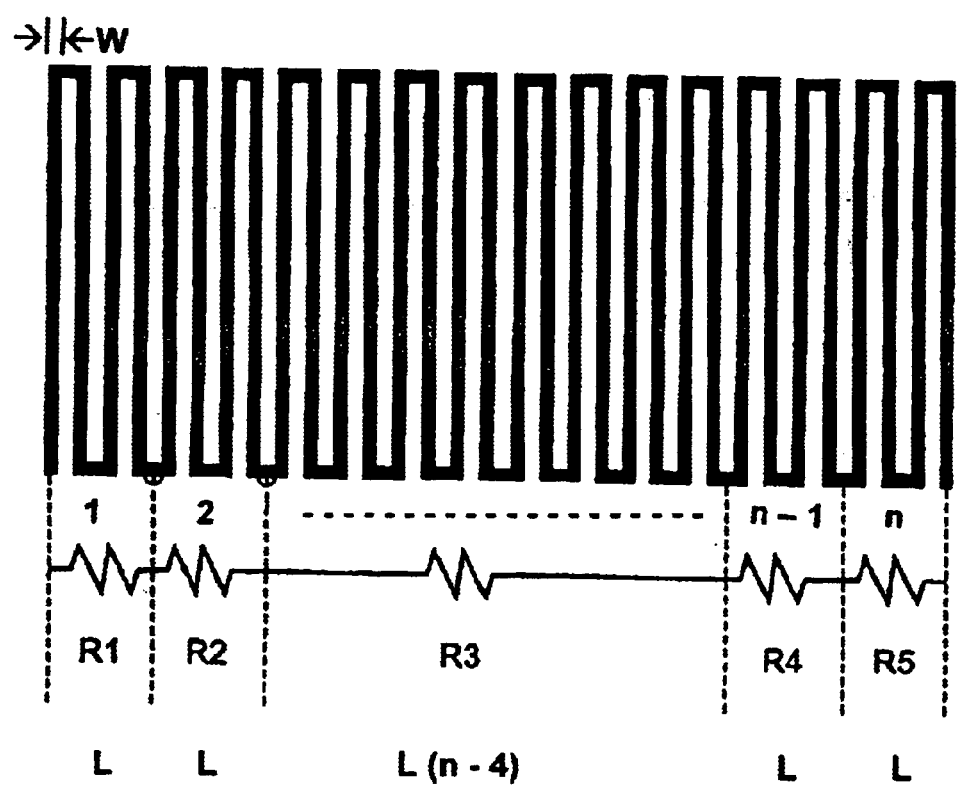
FIG. 3 is a view showing a conventional layout method for voltage division resistors.

FIG. 2 is a view showing a second embodiment of a layout method for voltage division resistors according to the invention, and as shown in the figure, a pattern of respective voltage division resistors R1, R2, R3, R4, and R5 is oriented in the longitudinal direction of a layout area. Accordingly, even in the case where the characteristic of a photolithographic system has manufacturing variations in terms of accuracy along the longitudinal direction of a layout area, such variations in the lateral direction can be evenly distributed with respect to respective resistance values, so that the respective voltage division resistors are hardly prone to variations in accuracy owing to a layout position thereof, thereby enabling highly accurate layout designing for voltage division resistors.

What is claimed is:

1. A method of disposing a resistor pattern layout of serially connected resistors, comprising:

preparing a resistor pattern area having a center portion, a first edge portion, and a second edge portion;

forming a first resistor pattern at the center portion by a photolithographic method, the first resistor pattern having a first end at the center portion and a second end at the first edge portion;

forming a second resistor pattern by the photolithographic method, the second resistor pattern having a third end at the center portion and a fourth end at the second edge portion, wherein the second resistor pattern is electrically insulated from the first resistor pattern; and electrically coupling the second end of the first resistor pattern with the fourth end of the second resistor pattern so that the first and second resistor patterns constitute serially connected resistors electrically connecting from the first end of the first resistor pattern to the third end of the second resistor pattern, and wherein the first resistor pattern and the second resistor pattern comprise a plurality of parallel lines connected in functional series by perpendicular segments disposed at alternating ends of adjacent pairs of the parallel lines.

2. A method of disposing a resistor pattern layout according to claim 1, wherein the serially connected resistors have a plurality of higher-accuracy resistors located in the center portion and a lower-accuracy resistor located in the first and second edge portions.

3. A method of disposing a resistor pattern layout according to claim 2, wherein the higher-accuracy resistors comprise four resistors each of which has a resistance R1 and the lower accuracy resistor having a resistance R2, and wherein a resistance ratio of R1 to R2 is set at 1:(n-4), and n represents a number of biases.

4. A method of disposing a resistor pattern layout according to claim 3, wherein n is in a range of about from 6 to 13.

5. A method of disposing a resistor pattern layout according to claim 1, wherein the serially connected resistors are used for an LCD driver.

6. A method of disposing a resistor pattern layout of serially connected resistors, comprising:

preparing a resistor pattern area having a rectangular shape, the resistor pattern area having short sides and long sides, a first edge portion located at one of the long sides, a second edge portion located at the other of the long sides and a center portion; and forming a resistor pattern by a photolithographic method, the resistor pattern extending from the first edge portion to the second edge portion through the center portion continuously, and wherein the resistor pattern comprises a plurality of parallel lines each of which has a length substantially equal to a length of the long sides of the resistor pattern area, the parallel lines connected in functional series by perpendicular segments disposed at alternating ends of adjacent pairs of the parallel lines.

7. A method of disposing a resistor pattern layout according to claim 6, wherein the serially connected resistors have a plurality of higher-accuracy resistors located in the first and second edge portions and a lower-accuracy resistor located in the center portion.

8. A method of disposing a resistor pattern layout according to claim 6, wherein the higher-accuracy resistors comprise four resistors each of which has a resistance R1 and the lower accuracy resistor having a resistance R2, and wherein a resistance ratio of R1 to R2 is set at 1:(n-4), and n represents a number of biases.

9. A method of disposing a resistor pattern layout according to claim 8, wherein n is in a range of approximately 6 to 13.

10. A method of disposing a resistor pattern layout according to claim 6, wherein the serially connected resistors are used for an LCD driver.

11. A method of providing a resistor pattern layout of serially connected resistors, comprising:

preparing a resistor pattern having first and second edge portions and a center portion;

forming a first resistor pattern by a photolithographic method, the first resistor pattern having a first end at the center portion and a second end at the first edge portion;

forming a second resistor pattern by the photolithographic method, the second resistor pattern having a third end next to the first resistor pattern and a fourth end at the second edge portion, wherein the second resistor pattern is physically apart from the first resistor pattern; and electrically connecting the second end of the first resistor pattern with the fourth end of the second resistor pattern so that the first and second resistor patterns constitute serially connected resistors, and wherein the first resistor pattern and the second resistor pattern comprise a plurality of parallel lines connected in functional series by perpendicular segments disposed at alternating ends of adjacent pairs of the parallel lines.

12. A method of disposing a resistor pattern layout according to claim 11, wherein the serially connected resistors have a plurality of higher-accuracy resistors located in the center portion and a lower accuracy resistor located in the first and second edge portions.

13. A method of disposing, a resistor pattern layout according to claim 11, wherein the higher-accuracy resistors including four resistors each of which has a resistance R1 and the lower accuracy resistor having a resistance R2, and wherein a resistance ratio of R1 to R2 is set at 1:(n-4), and n represents a number of biases.

14. A method of disposing a resistor pattern layout according to claim 13, wherein n is in a range of approximately 6 to 13.

* * * * *